US 6,610,262 B1

(12) United States Patent
Peng et al.

(10) Patent No.: US 6,610,262 B1
(45) Date of Patent: Aug. 26, 2003

(54) DEPLETION MODE SCR FOR LOW CAPACITANCE ESD INPUT PROTECTION

(75) Inventors: Kuo-Reay Peng, Tainan (TW); Jian-Hsing Lee, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/086,259

(22) Filed: Mar. 4, 2002

(51) Int. Cl.$^7$ .................... H01L 21/336; H01L 21/8234
(52) U.S. Cl. ........................ 423/197; 257/355
(58) Field of Search ................ 257/500, 355, 257/356, 357, 358, 359, 360, 361, 362, 363, 364, 365, 501, 511, 546; 361/56, 91.5, 91.1, 91.2, 88; 360/323; 438/197; 437/289

(56) References Cited

U.S. PATENT DOCUMENTS

| 5,537,284 | A | | 7/1996 | Haas, Jr. et al. ............... 361/56 |
| 5,821,572 | A | | 10/1998 | Walker et al. ............... 257/107 |
| 5,825,600 | A | | 10/1998 | Watt ............... 361/56 |
| 5,950,098 | A | * | 9/1999 | Oda et al. ............... 438/527 |
| 6,074,899 | A | | 6/2000 | Voldman ............... 438/155 |
| 6,333,528 | B1 | * | 12/2001 | Arita et al. ............... 257/295 |
| 6,344,385 | B1 | * | 2/2002 | Jun et al. ............... 438/237 |

OTHER PUBLICATIONS

Wu et al., "ESD Protection for Output Pad with Well–Coupled Field–Oxide Device in 0.5um CMOS Technology," IEEE Transactions on Electron Devices, vol. 44, No. 3, Mar. 1997, IEEE.
Ker et al., "ESD Protection Design on Analog Pin with Very Low Input Capacitance for High–Frequency or Current–Mode Applications," IEEE Journal of Solid–State Circuits, vol. 35, No. 8, Aug. 2000, IEEE.
Kleveland et al., "Distributed ESD Protection for High–Speed Integrated Circuits," IEEE Electron Device Letters, vol. 21, No. 8, Aug. 2000, IEEE.

* cited by examiner

Primary Examiner—Long Pham
Assistant Examiner—Dana Farahani
(74) Attorney, Agent, or Firm—George O. Saile; Stephen B. Ackerman

(57) ABSTRACT

The invention describes a structure and a process for providing ESD semiconductor protection with reduced input capacitance. The structure consists of a heavily doped P+ contact area residing in an N well region on a P substrate and electrically connected to the input pad of active integrated field effect transistor devices. NFET devices with floating gates and drains to reduce capacitance are located in the substrate near the N-well. The NFET source elements as well as the substrate are connected to ground. The NFETs are isolated from the N-well and associate P+ contact area by shallow trench isolation (STI) structures that reduce the NFET drain to substrate and N-well to substrate junction boundary area with a subsequent reduction in the junction capacitance. A voltage pulse from an ESD event will cause the SCR structure and associated parasitic bipolar transistors to trigger providing a path to ground for the ESD current, thereby protecting the internal circuits from damage.

21 Claims, 6 Drawing Sheets

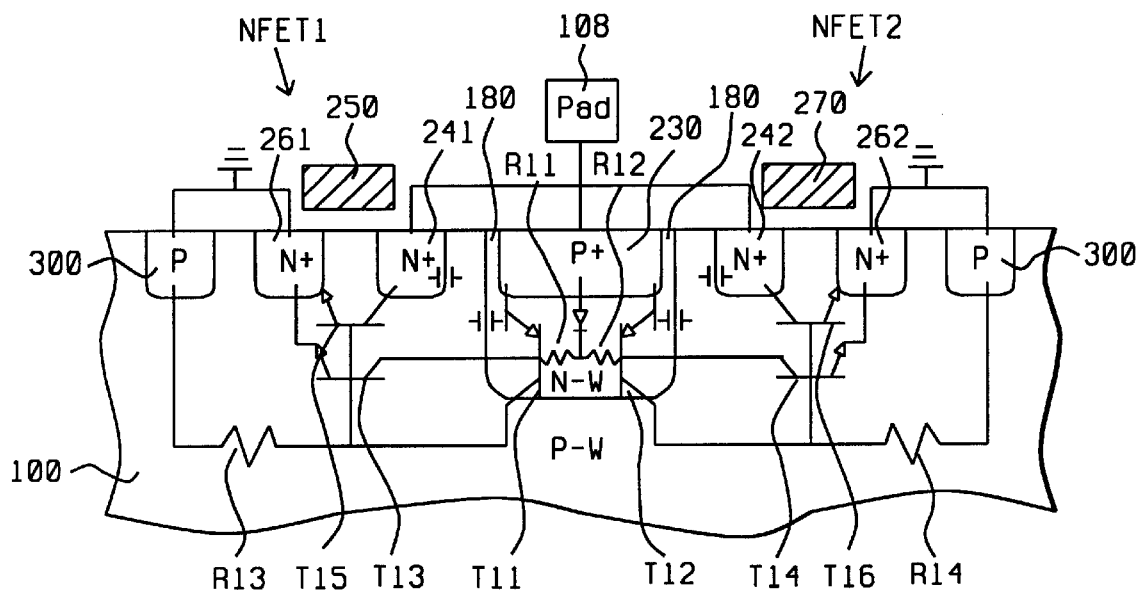
FIG. 1 – Prior Art
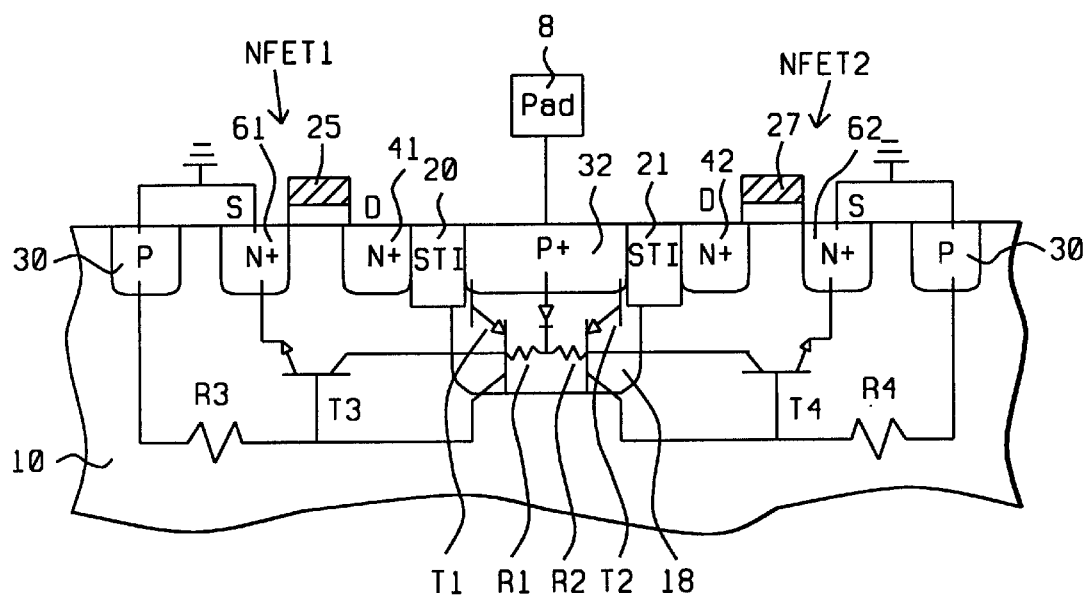
FIG. 2

DEPLETION MODE SCR FOR LOW CAPACITANCE ESD INPUT PROTECTION

BACKGROUND OF THE INVENTION

(1) Field of the Invention

The present invention relates generally to the structure and manufacturing process of a FET semiconductor device for ESD protection of electronic circuit devices and more particularly to a depletion mode SCR for low capacitance input ESD protection particularly suited to high frequency applications.

(2) Description of Prior Art

Because of high input impedance and thin oxide gate structures, the problem of electrostatic discharge damage (ESD) with field effect transistor (FET) devices can be severe. Therefore the input/output (I/O) circuit locations or pads usually have a protective device connected between the I/O pad and the internal circuits which allows the ESD current to be shunted to ground, protecting the active internal circuits from damage.

With prior art devices, the capacitance associated with the ESD protection device on the active circuit input pad can be in the order of 0.27 picofarads (pF) or greater. This capacitance is caused to a large degree by the N-well-P-substrate junction capacitance. For some logic operation application speeds, this capacitance may be acceptable. However, in high frequency applications such as radio frequency (RF) or other applications in the megahertz to gigahertz range, the input capacitance should be minimized as much as possible to avoid circuit performance degradation.

In the "Prior Art" as shown in FIG. 1 the active circuit signal input pad 108 is electrically connected to a P+ contact 320 of a N-well 180 that resides within a P substrate 100. The input pad is also electrically connected to the N+ drain 241 of NFET1 and N+ drain 242 of NFET2. NFET1 source 261 and NFET2 source 262 are electrically connected to a second voltage source, typically ground as shown in FIG. 1. The P substrate 100 is also connected to the second voltage, or ground, through the P+ substrate contacts 300. Depicted are the parasitic bipolar PNP transistors T11 and T12, and the parasitic bipolar NPN transistors T13, T14, T15, T16, and resistors R11, R12, R13, R14 which exist within the structure. Also shown is diode D11. Parasitic bipolar transistors T11 and T13 effectively function as a PNPN SCR device as do a parasitic transistors T12 and T14.

An ESD incident pulse will propagate through D11 and the base collector junction of T11 and 12 turning on T13, T14 T15 and Tl6, shunting the ESD current to ground. The circuit has appropriate feedback to maintain the shunted current flow until the ESD event is terminated. The device does offer ESD protection, but there is a large capacitance of approximately 0.27 pF associated with this prior art design. As previously mentioned, the capacitance comes primarily from the N well 300 to P substrate 100 junction as well as from the N+ NFET drain 241 and the P substrate 100 junction. This level of capacitance on the input circuit of an RF device can be detrimental to circuit high frequency performance. The invention provides a novel and unique structure and process that provides effective ESD protection while reducing the device capacitance by a nominal order of magnitude to the range of 0.02 to 0.03 pF.

The following patents and reports pertain to ESD protection.

U.S. Pat. No. 5.537,284 (Haas, Jr. et al.) Electrostatic Discharge Protection Device U.S. Pat. No. 5,821,572 (Walker et al.) Simple BICMOS Process for Creation of Low Trigger Voltage SCR and Zener Diode Protection U.S. Pat. No. 5,825,600 (Watt) Fast Turn-On Silicon Controlled Rectifier (SCR) for Electrostatic Discharge (ESD) Protection U.S. Pat. No. 6,074,899 (Voldman) 3-D CAMOS-ON-Soi ESD Structure and Method The following technical reports also refer to the subject of ESD protection in MOS circuits Wu et al., "ESD) Protection for output Pad with Well-Coupled Field-Oxide Device in 0.5 m CMOS Technology," IEEE Transactions on Electron Devices, Vol. 44, No. 3, March 1997, IEEE Ker et al., "ESD Protection Design on Analog Pin with Very Low Input Capacitance for High-Frequency or Current-Mode Applications, "IEEE Journal of Solid-State Circuits, Vol. 35, No. 8, August 2000, IEEE Kleveland et al., "Distributed ESD Protection for High-Speed Integrated Circuits," IEEE Electron Device Letters, Vol. 21, No. 8, August 2000, IEEE

SUMMARY OF THE INVENTION

Accordingly, it is the primary objective of the invention to provide an effective and manufacturable method and structure for reducing the capacitance of the protective device providing resistance to the potential damage caused by the phenomenon known as electrostatic discharge (ESD) by utilizing a low capacitance depletion mode SCR connected to an input pad of an integrated circuit device.

It is a further objective of the invention to improve ESD protection for high frequency and radio frequency (RF) applications by providing a low input capacitance structure that will have minimum impact on device performance while maintaining reasonable ESD protection levels.

A still additional objective of the invention is to provide the ESD protection with reduced capacitance without changing the characteristics of the internal circuits being protected and by using a process compatible with the process of integrated MOS device manufacturing.

The above objectives are achieved in accordance with the methods of the invention that describes a structure and a manufacturing process for semiconductor ESD protection devices with reduced input capacitance. A heavily doped P+ contact area residing in an N well region is connected to the input pad of active integrated field effect transistors (FETs). N-channel field effect transistor (NFET) N+ drain areas located adjacent to and on either side of the N-well within the P substrate body, as are the NFET N+ source regions and P+ substrate contact areas.

A unique feature of the invention is that it utilizes shallow trench isolation (STI) elements to reduce the NFET drains to substrate junction capacitance, and the N-well and associated P+ contact junction capacitance. This isolation elements are locate between the N-well P+ contact region and the NFET N+ drain regions and straddle the N-well to substrate junction boundary in the surface region. These STI elements have the effect of reducing the N+ drain to substrate boundary area, as well as N well to P substrate boundary area with a subsequent reduction in the input capacitance. In addition, the invention allows the NET gates and drains to be electrically floating which further reduces the capacitance on the input pad.

A voltage pulse from an ESD event will cause the parasitic bipolar transistors that effectively form a SCR device structure to trigger providing a path to ground for the ESD current, thereby protecting the internal circuits from damage.

BRIEF DESCRIPTION OF THE DRAWINGS

FIG. 1 shows a device cross-section and equivalent circuit diagram of parasitic transistor elements for a prior art ESD protection device.

FIG. 2 is a cross section of the invention SCR ESD protection device showing the parasitic elements.

DESCRIPTION OF THE PREFERRED EMBODIMENTS

Figure 3:
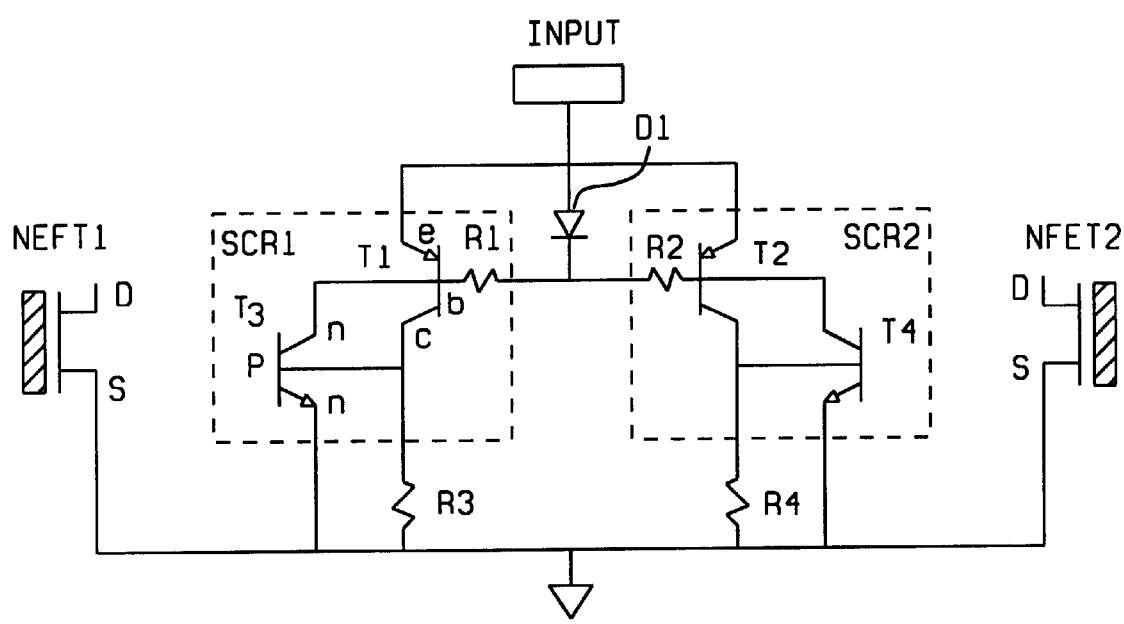
FIG. 3 is a schematic representation of the electrical elements of the invention ESD protection device.

FIG. 3 depicts the cross section of the low input capacitance depletion mode SCR with isolate N-channel FET elements. The figure also depicts the parasitic bipolar transistors elements within the structure. The structure is formed as indicated by the flow description shown in FIG. 4. A N-well 18 is created within the substrate 10. Multiple shallow trench isolation (STI) elements 20, are created within the substrate surface region, which abut the P+ N-well contact region 32, and bridge the N-well 18 to substrate 10. Poly gate elements 25, 27, are created on the substrate surface. The gate elements have an oxide insulation element and doped poly conductor element. N+ source regions 61, 62 and N+ drain regions are created which in conjunction with the gate elements, form NFET1 and NFET2. Several P+ contact regions 30 are created within the substrate 10 near the NFET source regions 61, 62. Also created is a P+ contact region 32 within the N-well 18. One aspect of the invention is to allow the NFET1 and NFET2 gates 25, 27 and drains 41, 42 to be floating electrically to minimize junction capacitance. A first electrical conductor system is created to connect the N-well 18 P+ contact 32 to a first voltage source, typically the active integrated circuit signal input pad 8. At the same time a second electrical conductor system is created which connects NFET1 source 61 and NFET2 source 62 as well as the substrate P+ contacts 30 to a second voltage source, typically ground. A passivation layer is created to protect the ESD protection device from the environment.

The vertical parasitic PNP bipolar transistors T1 and T2 depicted in FIG. 2 are formed from the N-well P+ contact region 32 for the emitters, the N-well region 18 for the base elements, and the P substrate 10 for the collectors. The diode D1 is formed with the anode being the P+ N-well contact region 32 and the cathode being the N-well 18. The resistors R1 and R2 are representative of the spreading resistance in the N-well area 18. Lateral parasitic NPN bipolar transistors T3 and T4 are formed from with the N+ FET drains 41, 62 for the emitters, the P substrate 10 for the base regions and the N-well 18 for the collectors. R3 and R4 are representative of the resistance in the substrate body 10 and are typically in the 200 to 2000 ohms per square range.

Figure 4:
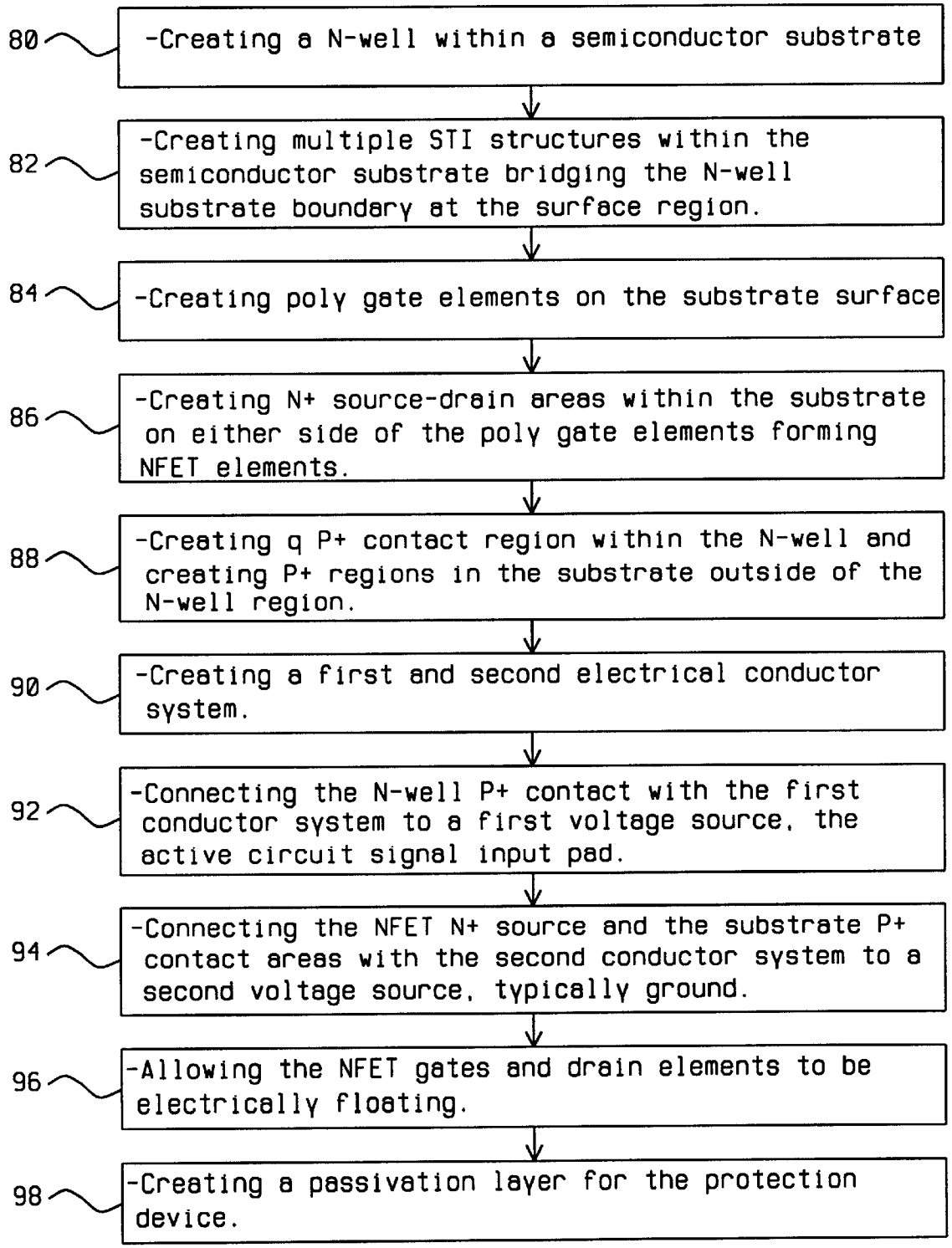
FIG. 4 is a flow chart of the process for the device protection circuit.

A representative electrical schematic of the parasitic bipolar transistors, the NFET elements and the input diode is shown in FIG. 4. When an ESD voltage incidence occurs, the charge through the diode D1 turns on the parasitic transistors T1 and T2 that then conduct part of the ESD current to ground. The collector currents flowing through R3 and R4 create a forward bias for transistors T3 and T4, turning them on also. The parasitic bipolar transistors T1 and T3 essentially form a SCR device as do transistors T2 and T4. Once triggered, the ESD current flows until the incident voltage is removed. This multiple parasitic transistor configuration provides additional shunt paths to ground enabling the handling of significant ESD current and affording good ESD protection to the internal active circuits.

Figure 5A:
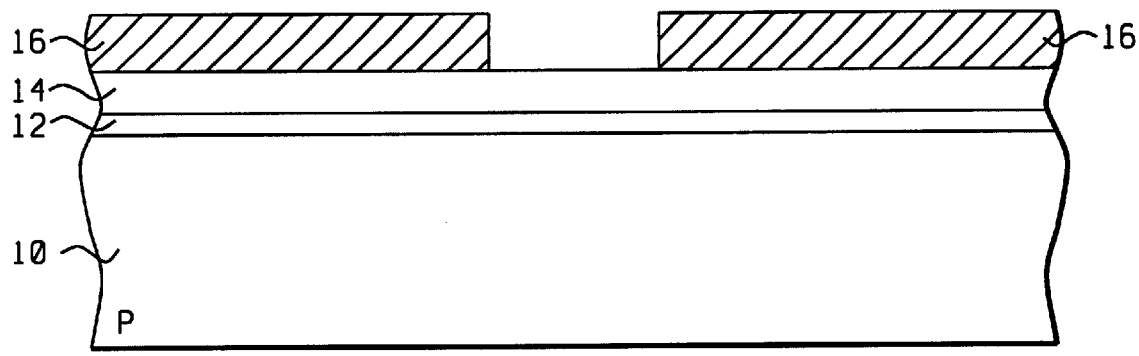
FIGS. 5A through 5F shows various stages of manufacture of the invention structure.
Figure 5B:
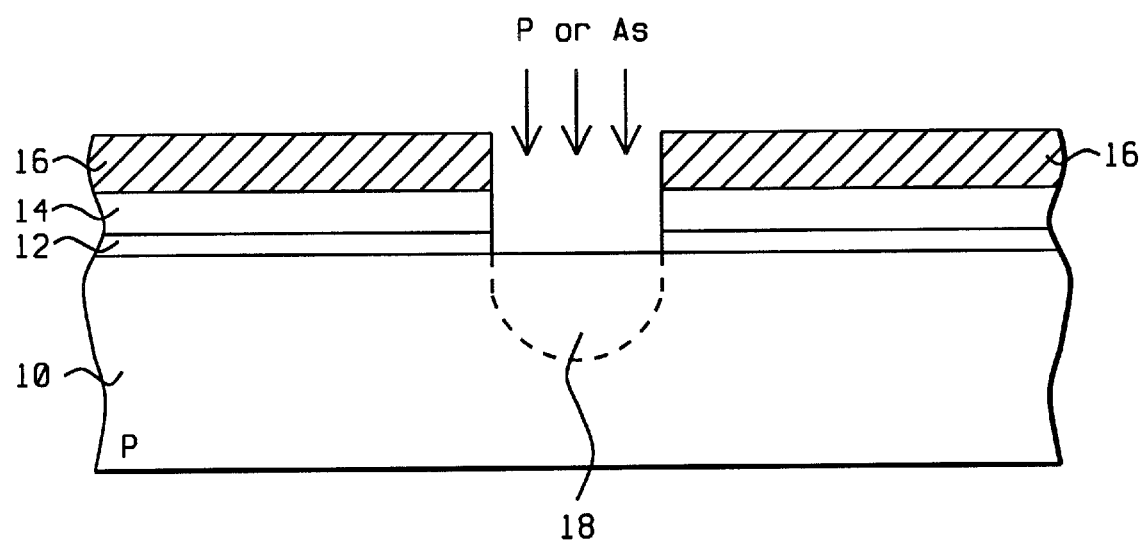

Referring to FIGS. 5A through 5F, the device is typically formed on a substrate 10 from a silicon wafer of 100 crystal orientation with a P doping, typically with Boron, to a level of about 5E15 atoms per cubic centimeter (a/cm$^3$). A thin layer of silicon dioxide (SiO$_2$) pad oxide 12 is thermally grown or deposited to a thickness of between 70 and 600 angstroms (Å) as a stress relief layer. This is followed by a chemical vapor deposition (CVD) silicon nitride (SiN) layer 14 between 800 and 2000 Å thick as depicted in FIG. 5A. After suitable patterning with photoresist 16, a dry anisotropic etch is performed typically by a RIE process on the nitride and pad oxide in preparation for the N-well 18 implant shown in FIG. 5B. A donor dopent such as phosphorous (P) or arsenic (As) is used with a dosage of between 1E11 and 1E14 a/cm$^2$ and implant energy between 30 and 100 KeV to produce the N-well region 18 with a dopent density between 5E15 and 1E18 a/cm$^3$. The N-well is tropically has a width of between 0.5 and 6 um and a depth of between 0.5 and 6 um.

Figure 5C:
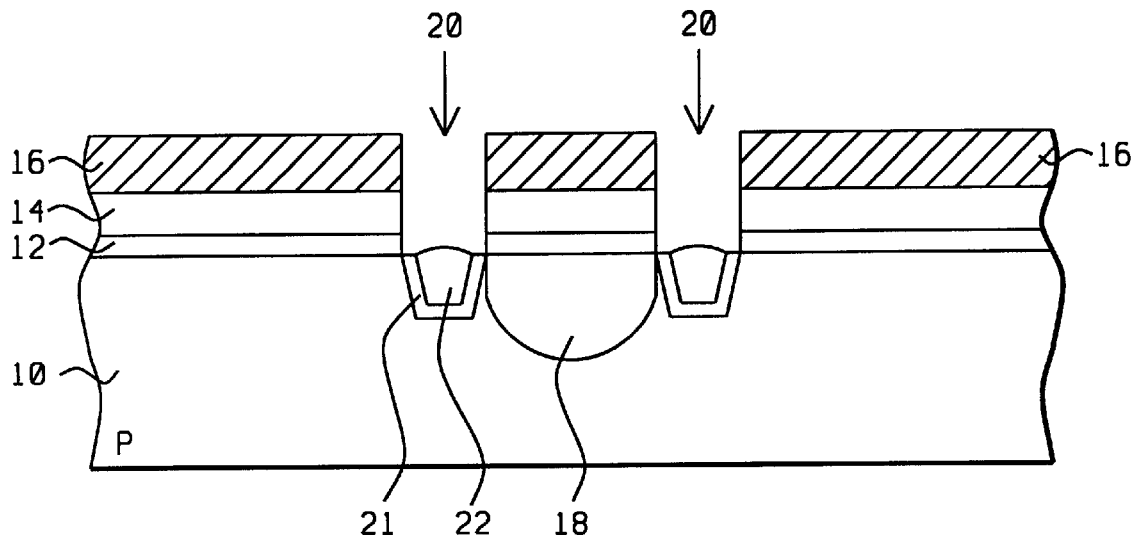

An oxide layer is grown or deposited over the device surface, and patterned in preparation for creating the shallow trench isolation (STI) structures 20 as indicated in FIG. 5C.

A dry, anisotropic etch is performed, again typically by a RIE process, to open the trench structures 20 in the substrate on either side of the N-well 18. These trench elements are typically between 0.1 and 3 um in width and between 0.5 and 4 um in depth. A thin protective SiO, layer 21 is thermally grown over the walls of the open trenches to a thickness between 50 and 500 Å and then the trenches are filled with a dielectric 22, typically SiO$_2$ to complete the isolation structure.

Figure 5D:
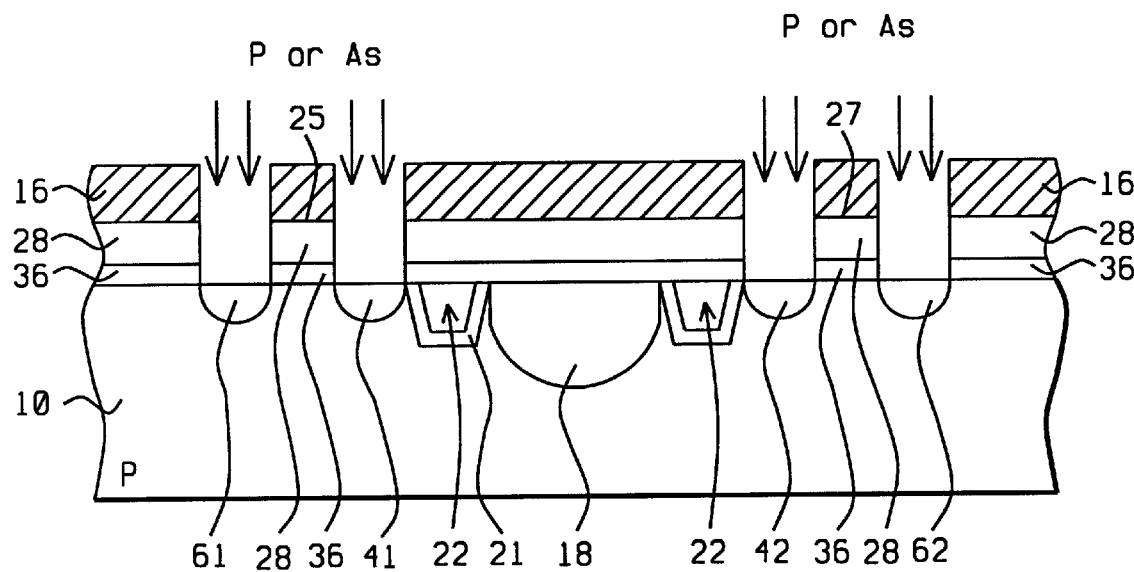

As depicted in FIG. 5D, processing continues with patterning and etching to prepare for the gate oxide deposition. A thermal growth of gate oxide 36, typically to a thickness of between 50 and 300 Å, is placed on the substrate. The gate oxide 36 is covered by a LPCVD deposition of polysilicon (poly) 36 which is subsequently donor doped to improve conductivity. A LPCVD of a mask oxide 38 is placed over the poly 36, and photoresist patterning is done to prepare for source/drain implantation. A dry etch is performed on the surface layers to provide an opening to the substrate for the source elements 61 and 62, and drain elements 41 and 42 of the NFETs. A donor implant, typically phosphorous (P), with a dosage between 1E14 and 1E17 a/cm$^2$ and with an energy of between 10 and 80 KeV is performed. This produces source and drain N+ regions with concentrations between 1E19 and 1E21 a/cm$^3$.

Figure 5E:
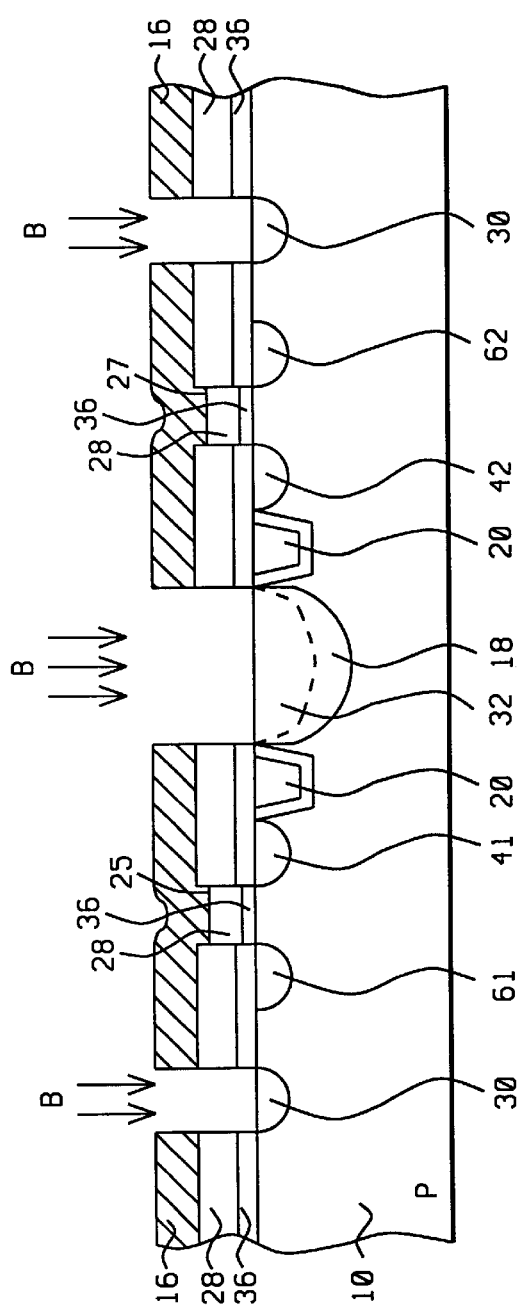
Figure 5F:
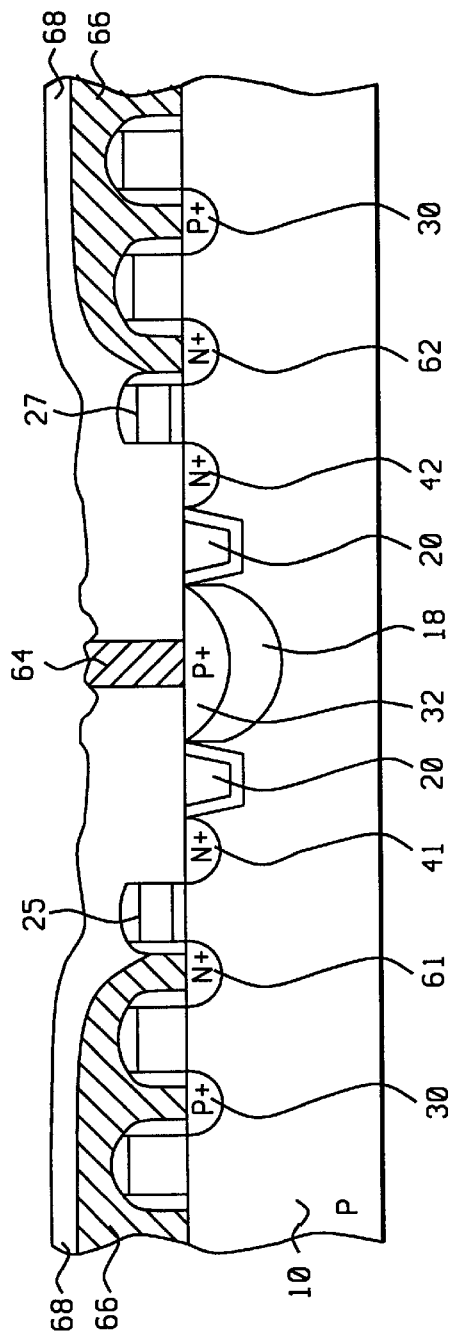

FIG. 5E depicts the structure prepared for the implanting of the substrate contact P+ regions 30 and the N-well P+ region 32. The partially completed semiconductor is again patterned with photoresist, and anisotropically etched. An acceptor dopent, typically boron (B), is implanted with a dosage level of between 1E14 and 1E17 a/cm$^2$ and with an energy of between 10 and 80 KeV. Again, this results in a P+ concentration of between 1E19 and 1E21 a/cm$^3$.

The conductor system 64 for the N-well P+ contact and the conductor system 66 for the N+ NFET source elements 61 and 62 and the P+ substrate contacts 30 are created by a blanket evaporation of a metal, typically aluminum or aluminum doped with 1% silicon. After evaporation any unwanted metal is etched typically with a RE process after being appropriately patterned. A protective passivation layer 68 is typically deposited $SiO_2$ doped with boron and phosphorous to form borophosphorus silicate glass. The deposition typically takes place with a temperature between 400 and 500° C. The deposition is often followed by a densification anneal at a temperature between 700 and 800° C.

The novel aspects of the invention are that the SU structures as well as the floating NFET gates and drains have the effect of reducing the capacitance on the input node of the active circuits. The unique structure has the capability of providing full ESD protection through the SCR and associated parasitic bipolar transistors while at the same time enabling reduced input capacitance critical to high frequency applications.

While the invention has been particularly shown and described with reference to the preferred embodiments thereof, it will be understood by those skilled in the art that various changes in form and details may be made without departing from the spirit and scope of the invention.

What is claimed is:

1. A method of forming a low input capacitance depletion mode SCR and isolated N channel FET ESD protection device on a semiconductor substrate comprising:

creating a N-well within said semiconductor substrate;

creating multiple STI structures within said substrate bridging said N-well and said substrate boundary in the surface region;

creating gate elements on said substrate surface;

creating N+ source and drain areas within said substrate on either side of said gate elements forming NFET elements;

insuring said gate elements and said NFET N+ drain elements are electrically floating;

creating a P+ contact region within said N-well region and creating P+ contact regions within said substrate outside of said N-well region;

creating a first and second electrical conductor system for said ESD protection device;

creating passivation for said ESD protection device.

2. The method according to claim 1 whereby said gate elements are comprised of a thin $SiO_2$ insulation layer and a polysilicon conductor element.

3. The method according to claim 1 whereby said P+ N-well contact region is connected to the active circuit signal input pad by said first electrical conductor system.

4. The method according to claim 1 whereby said NFET N+ source elements and said substrate P+ contact elements are connected to ground by said second electrical conductor system.

5. The method according to claim 1 whereby said conductor system is comprised of a metallurgy such as aluminum or aluminum doped with silicon.

6. The method according to claim 1 whereby said passivation is a silicon glass such as borophosphorus silicate glass.

7. A method of fabricating a low input capacitance depletion mode SCR and isolated N channel FET semiconductor device with associated parasitic bipolar transistors to provide ESD protection on a semiconductor substrate comprising:

Growing a first layer on said substrate surface;

depositing a second layer on surface of said first layer;

defining with a first patterning element a region for a first doped region;

Etching said first and said second surface layers for said first doped region;

implanting a dopent to form said first doped region;

reestablishing said surface layers;

defining with a second patterning element regions for isolation elements;

etching said surface layers and said substrate creating open shallow trenches for said isolation elements;

forming a protective covering on open walls of said open shallow trenches;

filling and capping and planarizing said shallow trench isolation elements;

replacing said first and second surface layers with a third surface layer;

depositing a conductive layer on said third surface layer;

defining with a third patterning element plurality of regions for a third doped region;

implanting said third regions with a donor element;

patterning with a fourth patterning element for a plurality of fourth doped regions;

implanting said fourth doped regions with an acceptor dopent;

forming a conductor system for said protection device;

forming a passivation layer for said protection device;

completing the processing of said protection device.

8. The method according to claim 7 wherein said substrate is doped with a donor element such as phosphorous to provide a P doping density of between 1E15 and 1E16 $a/cm^3$.

9. The method according to claim 7 wherein said first surface layer is thermally grown $SiO_2$ to a thickness of between 70 and 600 Å.

10. The method according to claim 7 wherein said second surface layer is SiN deposited by LPCVD to a thickness between 800 and 2000 Å.

11. The method according to claim 7 wherein said first doped region is formed with an ion implant of phosphorous (P) with an energy level between 30 and 100 KeV and a dosage level between 1E11 and 1E14 $a/cm^2$ to produce a N-well region with a concentration between 5E15 and 1E18 $a/cm^3$.

12. The method according to claim 7 wherein said shallow trench isolation elements are anisotropically etched by reactive ion etching to a width of between 0.1 and 3 um wide and between 0.5 and 4 um deep.

13. The method according to claim 7 wherein said protective coating on said open walls of said open shallow trenches consists of thermal deposited $SiO_2$ to a thickness of between 50 and 500 Å.

14. The method according to claim 7 wherein said shallow trench elements are filled and capped with thermally grown $SiO_2$.

15. The method according to claim 7 wherein said filled shallow trench isolation elements are planarized by chemical mechanical polishing.

16. The method according to claim 7 wherein said third surface layer is thermally deposited $SiO_2$ for gate insulator to a thickness between 50 and 300 Å.

17. The method according to claim 7 wherein said first conducting layer is polysilicon provided is by low pressure chemical vapor deposition at a temperature between 550 and 700° C. using a silane source or a gas with hydrogen or nitrogen.

18. The method according to claim 7 wherein said third doped regions are doped with phosphorous (P) with an energy level between 10 and 80 KeV and a dosage level between 1E14 and 1E17 $a/cm^2$ to produce N+ source drain areas with a dopent concentration of between E19 and E21 $a/cm^3$.

19. The method according to claim 7 wherein said fourth doped regions are doped with boron with an energy level between 10 and 80 KeV and with a dosage level between 1E14 and 1E17 a/cm$^2$ to produce said substrate P+ contact regions with a concentration of between E19 and E21 a/cm$^3$.

20. The method according to claim 7 wherein said conductor system is made by a blanket evaporation of aluminum doped with 1% silicon, followed by a RIE etched to remove unwanted metal.

21. The method according to claim 7 wherein said passivation layer consists of silicon oxide doped with boron and phosphorous to form borophosphorus silicate glass and is thermally deposited at a temperature between 400 and 500° C.

* * * * *